United States Patent [19]

Whelan et al.

[11] 4,027,275
[45] May 31, 1977

[54] CONTROLLER FOR A VARACTOR TUNER

[75] Inventors: Robert D. Whelan, W. Springfield; Richard D. Gibson, Wilbraham, both of Mass.

[73] Assignee: General Instrument Corporation, Clifton, N.J.

[22] Filed: Mar. 30, 1976

[21] Appl. No.: 671,821

[52] U.S. Cl. .................................. 334/15; 334/51; 338/160; 338/180; 338/202

[51] Int. Cl.² ..................... H03J 5/30; H01C 10/42

[58] Field of Search .......... 338/160, 180, 202, 128, 338/134, 176, 306, 315; 334/15, 50, 51; 323/74, 80, 94 R; 325/464, 465

[56] References Cited

UNITED STATES PATENTS

| | | | |
|---|---|---|---|
| 3,601,703 | 8/1971 | Midgley | 334/15 X |
| 3,602,867 | 8/1971 | Kohler | 338/128 X |
| 3,755,742 | 8/1973 | Maugans | 325/465 X |
| 3,905,097 | 9/1975 | Beetle | 338/128 UX |

*Primary Examiner*—Paul L. Gensler
*Attorney, Agent, or Firm*—James & Franklin

[57] ABSTRACT

A turret-type controller includes a base with a plurality of resistive strips mounted thereon, each of which is associated with a conductive contact movable with respect thereto. A pair of annular conductive strips are also situated on the base, but axially spaced from the resistive strips. The annular conductive strips are each operably connected to a different end of the resistive strips by means of a conductive strip, one of which is at least partially situated on the underside of the base. Each of the resistive strips has a length preselected such that the change in the magnitude of the tuning signal required to provide a given frequency change in the tuner in different regions of the frequency spectrum is achieved through substantially equal variations in the conductive contacts associated with each resistive strip.

37 Claims, 8 Drawing Figures

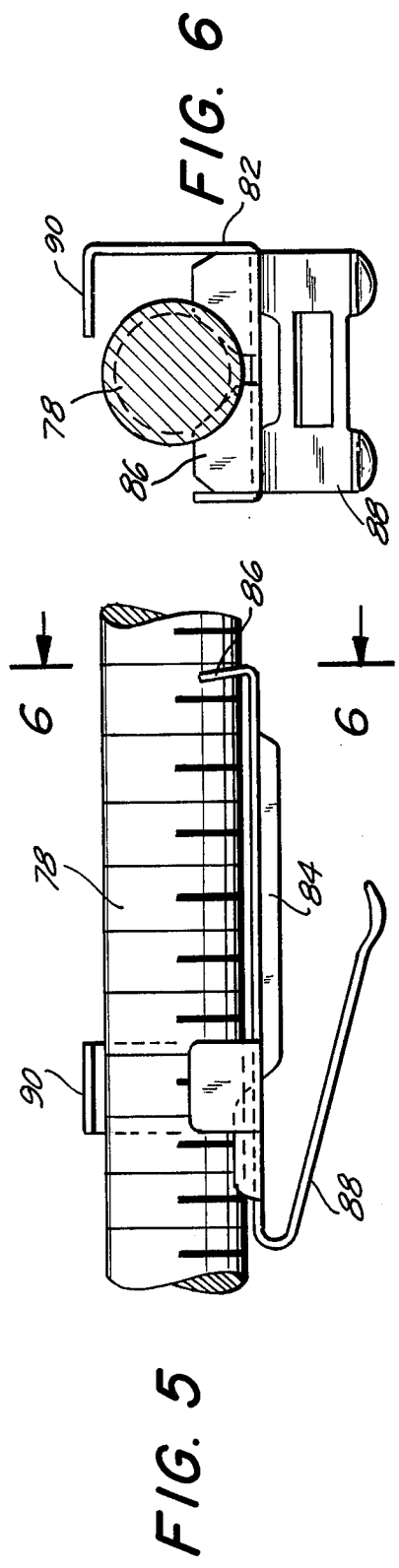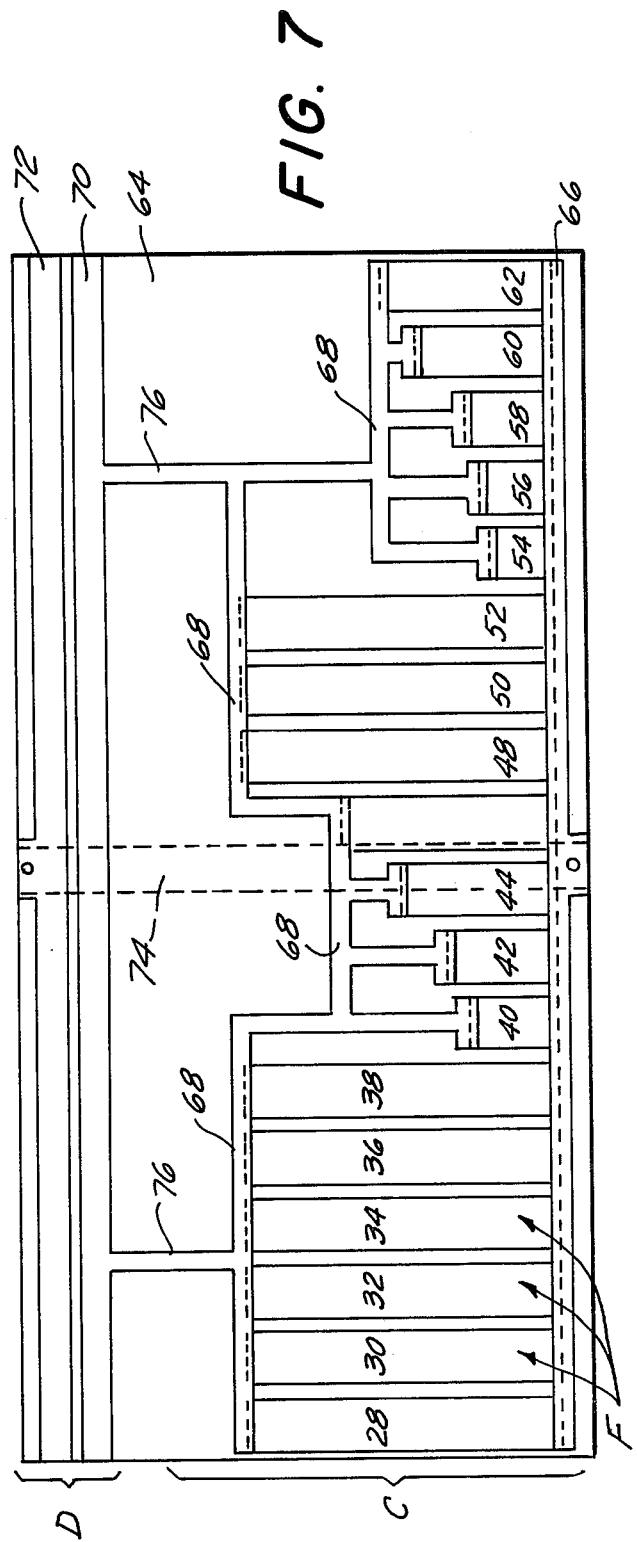

CONTROLLER FOR A VARACTOR TUNER

The present invention relates to tuning assemblies for use in communications systems and, more particularly, to a controller for use with a varactor tuner.

A varactor tuner incorporates a signal controlled element which serves to regulate a resonant frequency circuit to select a desired frequency. The signal controlled element may comprise one or more voltage controlled capacitors, commonly called varactors. The capacitance of such a varactor is variable in accordance with the input voltage thereto. When the varactor is placed in a resonant frequency circuit, the resonant frequency thereof will be regulated by the capacitance of the varactor which, in turn, is determined by the input voltage signal thereto. Thus, the resonant frequency circuit can be tuned to any desired frequency within its range by merely adjusting the input voltage to the varactor.

Such a system, as is well known in the art, has advantages over conventional gang-tuned capacitor or inductor type tuners, as it requires no mechanically operated capacitors or inductors whose characteristics are subject to environmental conditions and wear. In addition, such tuners require less space than their conventional counterparts and are less expensive to produce.

A varactor tuner must, however, be utilized in conjunction with a component which accurately generates or controls the input voltage to the voltage controlled tuning elements. Such a controller must perform the voltage generating function with adequate resolution to provide the necessary fine tuning capability and, in addition, retain information concerning the precise voltage required to coarse and fine tune the varactor tuner to the necessary frequencies corresponding to each of a plurality of different channels within the reception range of the communications receiver. The controller must perform these functions reliably and, due to the recent trend in miniaturization of communications receivers, do so in a minimum amount of space. Moreover, the controller must be relatively inexpensive to produce and assemble and be composed of relatively simple parts which function together reliably throughout the life of the communications receiver, require a minimum of maintenance and permit relatively easy repair or replacement.

One type of controller which has been utilized in the past has a number of different valued preset resistance elements which can be switched into the voltage generating circuit to regulate the magnitude of the output thereof. However, because the voltage-capacitance characteristics of varactors are not linear throughout the range thereof, it is quite difficult to form a circuit which is capable of accurately generating all of the necessary voltages without requiring a great many different preset resistance elements. Further, a complex system of switches is required to connect the appropriate resistance elements into the circuit. This type of controller requires a relatively large amount of space within the communications receiver, is quite complex and, thus, the manufacture, assembly, maintenance and repair costs thereof are relatively high. Moreover, the value of the preset resistance elements are highly dependent upon environmental conditions, such as temperature and humidity, and, therefore, a variation in environmental factors may cause changes in the characteristics of the circuit which are not normally compensated for.

Another type of controller for a varactor tuner which has been utilized comprises an element, such as a rotatable drum or turret, which is positionable in accordance with the frequency desired to be selected by the varactor tuner. At each position, a variable resistance element is situated which is connected into the voltage generating circuit when that position is selected. The magnitude of the resistance of each of the resistance elements can be varied to provide the necessary coarse and fine tuning and, in addition, will remain set at a particular value until changed so that each time the channel corresponding to a particular resistance element is tuned, the value of that resistance element previously set will be revived to generate the necessary voltage. Controllers of this type have the advantages of requiring a relatively small number of resistance elements and being composed of relatively simple parts which are inexpensive to manufacture, produce, maintain and repair and which operate reliably throughout the life of the receiver.

On the other hand, conventional "turret-type" controllers require either that the resistance elements be manufactured individually and then mounted on the turret or manufactured directly on the turret, both of which are relatively costly operations. Further, it is difficult to fabricate the resistance elements such that actuation of the fine tune control to the same degree produces a given fine tune adjustment for each channel within a band. This is known as "fine tune speed" and it is preferable, from an operations standpoint, to have the "fine tune speed" for each channel within a band as nearly equal as possible. Moreover, since the turret is rotationally mounted within the controller, difficulties arise relating to the the placement and design of the parts which form the electrical connections between the turret and the remainder of the controller.

The present invention relates to certain structural improvements in drum or turret-type controllers which enhance the usefulness of such assemblies due to more efficient structural design and which, is addition, permit the manufacture thereof in a more advantageous manner.

It is, therefore, a prime object of the present invention to provide a controller for a varactor tuner which utilizes a rotatable cylindrical turret which is divided into a signal determining portion and an electrical coupling portion, the electrical coupling portion extending axially beyond the signal determining portion to facilitate electrical connection between the turret and the remainder of the controller.

It is another object of the present invention to provide a controller for a varactor tuner wherein the signal determining portion of the cylindrical turret comprises a separately manufacturable planar base of non-conducting material upon which all of the resistive strips and interconnections are situated and which is then utilized to form a part of the turret.

It is a further object of the present invention to provide a controller for a varactor tuner wherein the coupling portion of the turret has a pair of annular conductive strips thereon, one of these strips being electrically connected to one side of each of the resistive strips by a conductive strip on the exterior surface of the turret and the other of the annular strips being connected to the opposite end of each of the resistive strips by a conductive strip which is situated on the interior surface of the turret.

It is still another object of the present invention to provide a controller for a varactor tuner wherein electrical contact between the turret and the support upon which it is mounted is provided by means of three brushes of contacts, two of which engage the annular rings, respectively, and the third of which engages the contact means for a selected one of the resistive strips, all of the brushes or contacts being situated in the same area, at one side of the turret.

It is still another object of the present invention to provide a controller for a varactor tuner wherein the value of the resistance elements is varied by means of a contact member movable along a rotatable shaft, the contact member having a flag thereon so as to facilitate a visual determination of the position of the contact member with respect to its aligned resistive strip.

It is still another object of the present invention to provide a controller for a varactor tuner wherein each of the resistive strips has a length preselected such that the change in the magnitude of the tuning signal required to produce a given frequency change in the varactor tuner is achieved for each channel in a band through the variation of the position of the contact member by an equal distance so as to provide a constant fine tuning speed.

In accordance with the present invention, a tuning assembly is provided including a support and a turret rotatably mounted on the support. The turret has a substantially cylindrical surface and comprises a signal determining portion having situated on the cylindrical surface a plurality of resistive strips and a coupling portion electrically connected to each of the resistive strips, and extending axially beyond the signal determining portion. Means are mounted on the signal determining portion to individually contact each of the strips at a variable location thereon and are effective, when the strips are energized, to produce a tuning signal therefrom, the magnitude of which is determined by the location of the contact means.

An energization source is provided. Means situated on the support in alignment with the coupling portion, operatively connected to the source, are effective to electrically connect the coupling portion to the source so as to energize the resistive strips. Means are provided on the support in alignment with the contact means and are effective to electrically engage a selected one of the contact means to produce the tuning signal therefrom. The contact means from which the signal is obtained is selected in accordance with the rotational position of the turret and corresponds to the tuned channel.

First and second conductive strips are provided on the signal determining portion, each of which is connected to a different end of each of the resistive strips so as to form an electrical circuit wherein the resistive strips are preferably situated in parallel. First and second annular conductive strips are provided on the coupling portion, the first annular conductive strip being operably connected to one of the conductive strips on the signal determining portion by means of a conductive strip situated on the exterior surface of the turret. The other annular conductive strip is operably connected to the other conductive strip on the signal determining portion by means of a conductive strip, a portion of which is situated on the reverse surface of the non-conductive base upon which the resistive and conductive strips are formed. The base, after manufacture thereof, is affixed to the turret to become the outer surface thereof. The connecting means aligned with the coupling portion comprise first and second brushes situated to engage the first and second annular strips, respectively, in all rotational positions of the turret so as to energize the circuit of which the resistive strips form a portion.

The contact means comprises a plurality of threaded rotatable conductive shafts, a different one of which is aligned with, but spaced from, each of the resistive strips. Each of these shafts is journaled at each end in a pair of spaced ring sections, one of which is mounted essentially at the end of the turret and the other one of which divides the turret into the signal determining portion and the coupling portion. Situated on each of these rotatable shafts is an internally threaded contact member which electrically engages the resistive strip aligned therewith and which is movable along the shaft in accordance with the rotation thereof.

The edge of each of the shafts journaled in the ring section adjacent the coupling portion extends outwardly beyond the ring section so as to engage a third brush, when it is in the appropriate rotational position. In this manner, electrical contact is made between the support and the selected resistive strip by means of the third brush, the appropriate shaft and contact member. All three of the brushes are situated in the same location on the support and aligned with the same end of the turret. Each contact member is provided with a flag thereon to facilitate a visual determination of the position of the contact member along the aligned resistive strip.

Each of the resistive strips corresponding to the channels in a band has a length which is preselected such that the change in the magnitude of the tuning signal required to produce a given frequency change in the varactor tuner is achieved through an equal variation in the position of the contact member relative to the aligned resistive strip. In this manner, the degree of actuation of the fine tuning member connected to move the contact member along the aligned resistive strip required to produce a given frequency change for each channel in a band is the same, thereby providing a constant fine tune speed.

To the accomplishment of the above and to such other objects as may hereinafter appear, the present invention relates to a controller for a varactor tuner as set forth in the annexed claims and described in the present specification, taken together with the accompanying drawings wherein like numerals refer to like parts and in which:

FIG. 2a is a cross-sectional view of the section of FIG. 2 showing the thumbwheel in its disengaged position;

FIG. 5 is an enlarged side view of a portion of a rotatable shaft and a contact member mounted thereon;

FIG. 6 is a cross-sectional view taken along line 6—6 of FIG. 5; and

FIG. 7 is a plan view of the non-conductive planar base having the resistive strips situated thereon prior to the mounting thereof on the turret.

Figure 1:
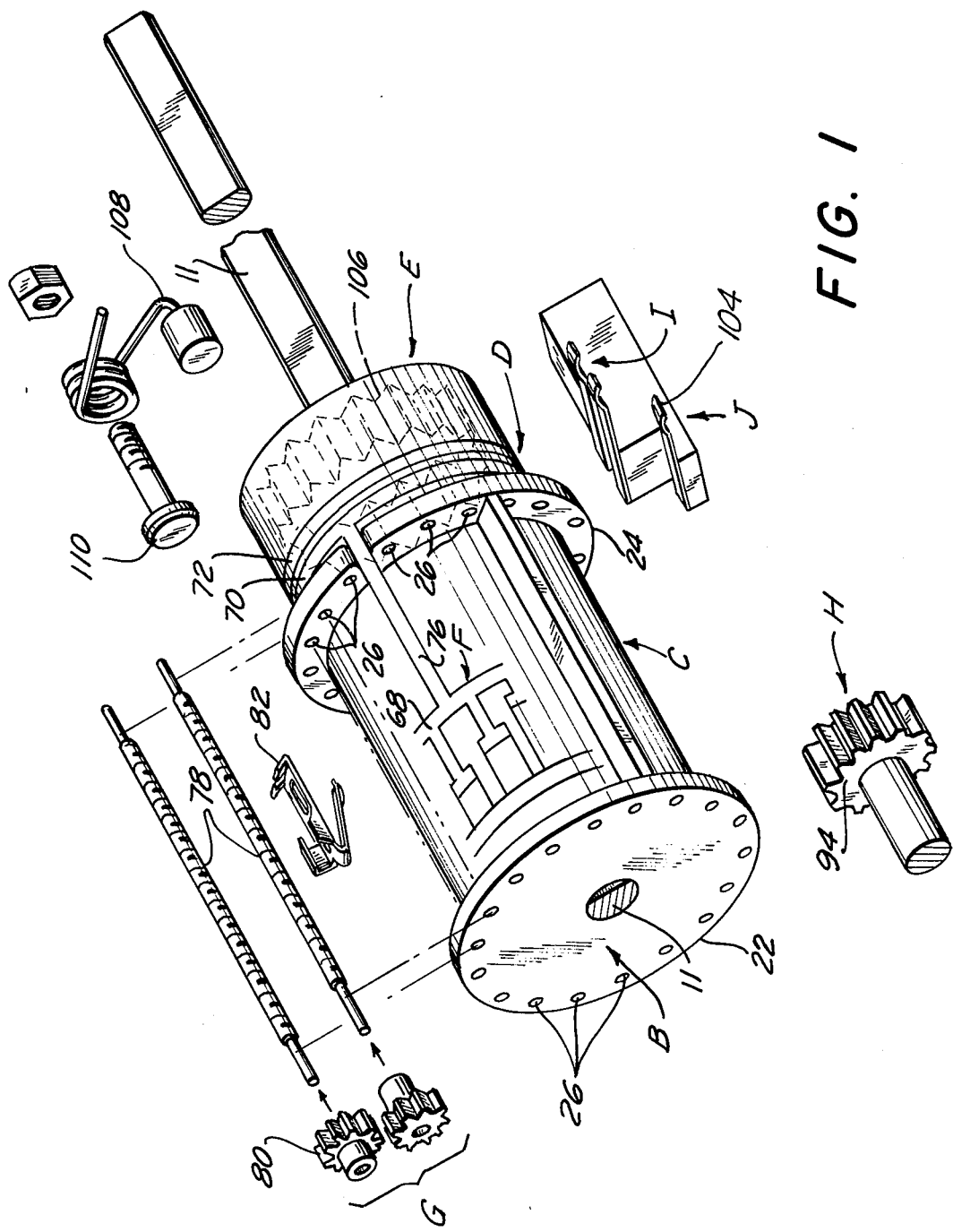
FIG. 1 is an exploded isometric view of the turret of the present invention.
Figure 2:
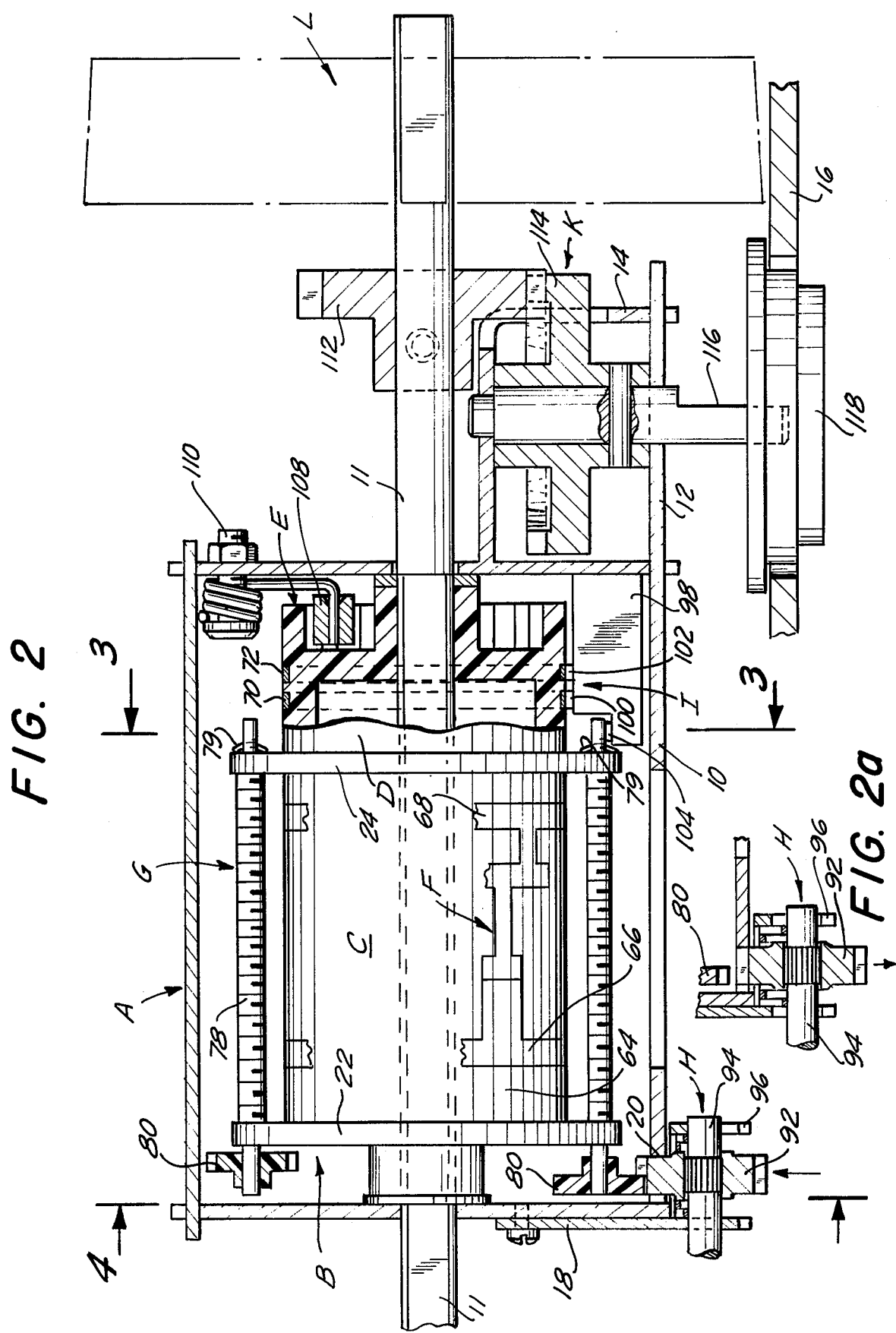
FIG. 2 is a side cross-sectional view of the present invention showing the thumbwheel in its engaged position.
Figure 3:
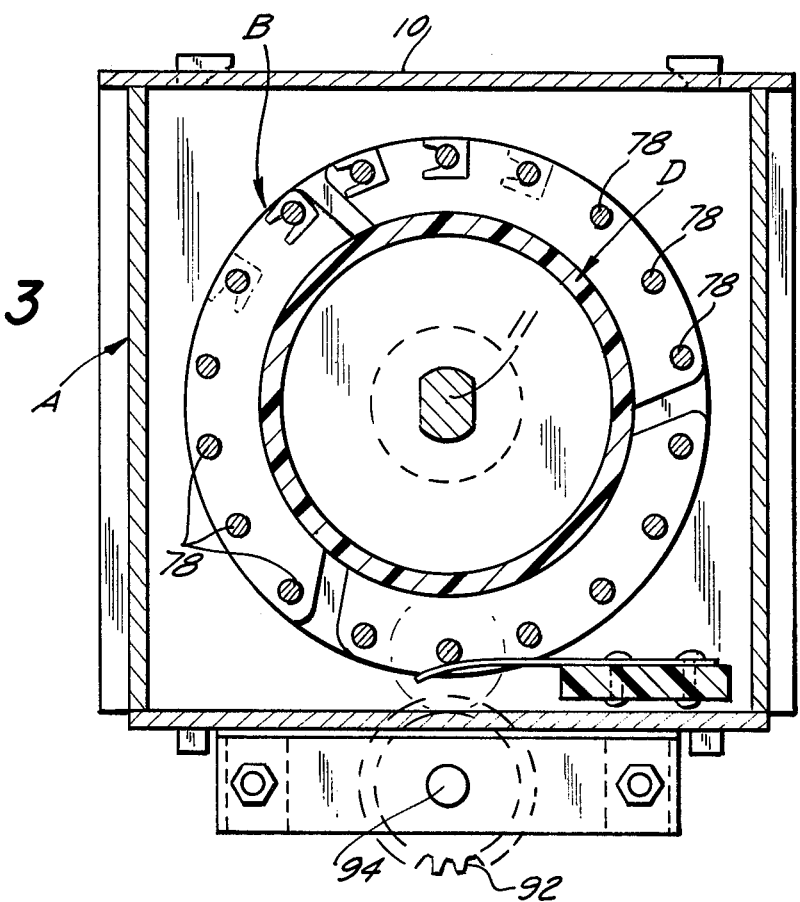
FIG. 3 is a cross-sectional view taken along line 3—3 of FIG. 2.
Figure 4:
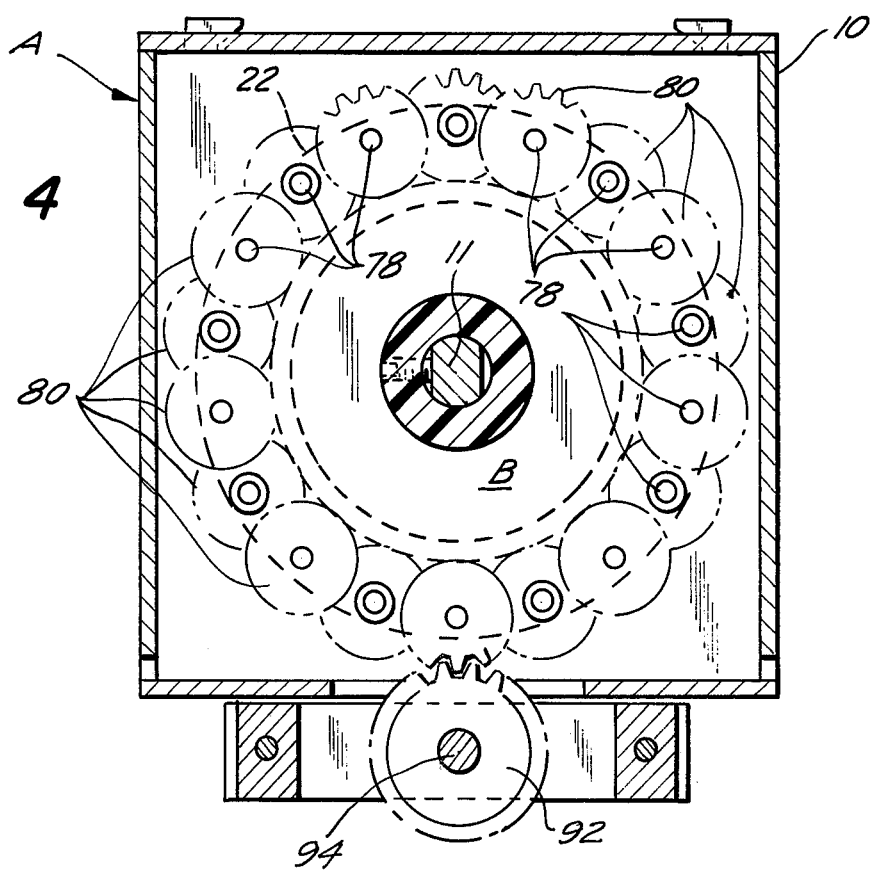
FIG. 4 is a cross-sectional view taken along line 4—4 of FIG. 2.

As best seen in FIGS. 1 and 2, the present invention relates to a controller for a varactor tuner including a support, generally designated A, upon which a turret, gnerally designated B, having a substantially cylindrical surface, is rotatably mounted. The turret includes a signal determining portion, generally designated C, and a coupling portion, generally designated D. A detent mechanism, generally designated E, is operatively connected to turret B to facilitate precise positioning thereof.

A plurality of resistive strips, generally designated F, are formed on a non-conductive base which is affixed to the turret to form the exterior surface of signal determining portion C. Means, generally designated G, are also mounted on signal determining portion C to individually contact each of the resistive strips F at a variable location thereon and are effective, when the resistive strips F are energized, to produce a tuning signal, the magnitude of which is determined by the location of the point of contact between means G and the aligned resistive strip F. Means, generally designated H, are mounted on support A for varying the point of contact between means G and the aligned resistive strip F.

Means, generally designated I, are mounted on support A in alignment with coupling portion D of turret B and operatively connected to an energization source (not shown). Means I are effective to electrically connect the coupling portion to the source so as to energize resitive strips F. Means, generally designated J, mounted on support A in alignment with contact means G, are effective to electrically engage a selected one of the contact means to obtain the tuning signal therefrom. Means J engages a single contact means G which is selected in accordance with the rotational position of turret B. Means, generally designated K, are provided to permit manual or mechanical positioning of turret B. In addition, means, generally designated L, are provided for displaying channel indicia corresponding to the channel selected by the controller of the present invention and the varactor tuner utilized in conjunction therewith.

More specifically, turret B is mounted on support A within an enclosure 10 made of any suitable rigid material. Turret B is mounted on a shaft 11 which is journaled in the sides of enclosure 10. The front wall of enclosure 10 is extended at 12 to provide a structure for mounting a bracket 14 forming a base for a portion of the turret rotating means K. Support A is mounted behind the front wall 16 of the chassis of a communications receiver. The varactor tuner (not shown) is also mounted within the chassis of the communications receiver. Varactor tuners are well known in the art and the particular form thereof which is utilized in conjunction with the controller of the present invention forms no part of the present invention and, therefore, the varactor tuner is not illustrated. A bracket 18 is mounted to the left side wall (as seen in FIG. 2) of enclosure 10 and serves as a mounting for contact means position varying means H which extends into the interior of enclosure 10 through an opening 20 on the front wall thereof.

Turret B preferably comprises a hollow cylindrical structure upon which a pair of ring sections 22 and 24 are mounted. Ring section 22 forms the left hand end (as seen in FIGS. 1 and 2) of turret B. Ring section 24 is situated along turret B so as to divide the turret into the signal determining portion C and coupling portion D. The diameter of each of the ring sections 22, 24 is greater than the diameter of the turret such that the peripheries of each of the ring sections extend above the exterior surface of the turret. The extended peripheries of each of the ring sections 22, 24 are provided with corresponding sets of equally spaced apertures 26 which are aligned so as to permit mounting of contact means G therein.

The exterior surface of signal determining portion C and coupling portion D of turret B are formed of a suitable non-conductive material 64 which is fabricated in a substantially planar form, as illustrated in FIG. 7. The resistive strips F, designated 28, 30, 32, 34, 36, 38, 40, 42, 44, 46, 48, 50, 52, 54, 56, 58, 60 and 62, are deposited on non-conductive base 64 between conductive strips 66 and 68 which extend along the width of the base 64 with the resistive strips situated therebetween. Spaced from conductive strip 68 on base 64 are situated conductive strips 70 and 72 which, when base 64 is formed into the cylindrical structural of turret B, will become annular conductive strips situated on the coupling portion D. Conductive strip 66 is electrically connected to conductive strip 72 by means of a conductive strip 74 which is situated on the reverse side of base 64 and, thus, will not be positioned on the exterior surface of the cylindrical structure when base 64 is formed into turret B. Conductive strip 68 is electrically connected to conductive strip 70 by a pair of conductive strips 76 which are mounted on the exterior surface of base 64. As seen in FIG. 1, the appropriate openings in ring section 24 are provided to permit conductive strips 76 to connect the signal determining portion G and the coupling portion D.

The controller described herein, for purposes of illustration only, is provided with 18 separate resistive strips F and, thus, is capable of controlling a varactor tuner to tune to any one of eighteen channels or stations. When utilized in a television receiver, the controller may be utilized to tune varactor tuners capable of reception in the UHF and the VHF ranges. Some of the resistive strips F, therefore, are utilized in the tuning of UHF channels and others can be utilized in the tuning of VHF channels.

It should be noted that certain of the resistive strips 28, 30, 32, 34, 36, 38, 48, 50, and 52 are equal in length, whereas others of the resistive strips F, namely, 40, 42, 44, 46, 54, 56, 58, 60 and 62 have a variety of different lengths. This configuration permits the controller to have an equal fine tune speed for each channel within a given band. The length of each of the resistive strips within a band is preselected such that the change in magnitude of the signal required to produce a given frequency change in the varactor tuner is achieved through the variation of the position of the contact means by an equal distance for each channel in that band. In other words, for each channel, an equal actuation of the contact means position varying means H will cause approximately the same change in the frequency of the varactor tuner and, thus, result in an equal degree of fine tuning.

The resistive strips utilized to tune UHF channels are all equal in length because the voltage change to the input of a varactor tuner necessary to cause a given frequency change is approximately linear over the UHF range between channels 14 and 68. For example, in this range, a varactor tuner may require a 0.3 volt change in input voltage to cause a 6 MHz change in the tuner frequency. Beyond channel 68, the change in input voltage required to produce a 6 MHz change in frequency increases, resulting in a gradual decrease in the senstivity of the fine tune control. One manner in which this decrease in sensitivity can be compensated for in the UHF channels above channel 68 would be to taper the resistive strip to the necessary degree. However, the controller of the present invention does not employ tapering of the width of the resistive strips because such would interfere with the optimum design of the contact member. A fine tune speed of 40 Kc per degree of rotation of the shaft upon which the contact is mounted has, by way of example, been found to be acceptable.

The variation in the input voltage to the varactor tuner required to produce a given change in the tuned frequency does, however, chanbge substantially over the range of VHF channels. Therefore, in order to maintain a substantially constant fine tune speed throughout the VHF channels in the high and low bands, respectively, a variation in the length of the resistive strips utilized to tune the VHF channels is required.

The relationship between the variations in the input voltage to the varactor tuner required to produce a given change in tuned frequency throughout the UHF channels as compared with the smallest variation in input voltage required to produce a given change in tuned frequency for VHF channels governs the ratio of the UHF fine tune speed to the VHF fine tune speed. A typical VHF varactor tuner would require approximately a 1 volt change in the input voltage to create a 6 MHz change in the tuned frequency at channel 2. This relationship increases non-linearly to a requirement of about a 6 volt change in input voltage to achieve a 6 MHz change in tuned frequency at channel 6. A similar spread occurs in the high band range, namely, channel 7 to channel 13. If a resistive strip having the same length as the resistive strips utilized in UHF tuning is selected for channel 2, a voltage change of approximately 3.33 (1 volt/0.3 volt) times as great is required to produce the same change in tuned frequency as the UHF resistive strips will produce. Thus, a VHF fine tune speed of approximately one-third of that of the UHF fine tune speed, namely, 12 Kc per degree is achieved, assuming the same screw thread and drive ratio as for UHF.

Since channel 6 requires approximately six times the input voltage variation to produce a given change in tuned frequency, as compared with that of channel 2, the resistive strip utilized to tune channel 6 is made one-sixth the length of the resistive strip utilized to tune channel 2. Thus, the length of each strip is inversely proportional to the amount of change in the magnitude of the tuning signal required to produce a given frequency change in the tuner. This results in a 12 KHz per degree fine tune speed for channel 6. The resistive strips for tuning the channels between channels 2 and 6 are balanced accordingly.

The channels between channel 7 and channel 13 have a similar input voltage per change in tuned frequency spread to the channels between channel 2 and channel 6. Therefore, the lengths of the resistive strips associated with each of these channels are calculated accordingly.

The voltage variations in varactor tuners preclude the dedication of a potentiometer for each of the VHF channels. For this reason, it has been considered preferable to permit each resistive strip to tune every channel within its VHF band. As a result, it is possible to tune any low band VHF channel (channel 2 through channel 6) on any low band resistive strip and, likewise, any high band VHF channel (channel 7 through channel 13) on any high band resistive strip. However, each VHF potentiometer will produce the required 12 Kc/degree of fine tune speed only when the channel assigned to it is tuned. For example, if channel 6 were tuned on the channel 2 resistive strip, the fine tune speed would be six times slower or 2 Kc/degree. Likewise, if channel 2 were tuned on the channel 6 resistive strip, the fine tune speed would be six times faster than normal or 72 Kc/degree. However, it is customary to preset the VHF channels at the factory such that only an occasional minor adjustment is required by the user.

Referring to FIGS. 1–4, contact means G comprises a plurality of individually rotatable threaded shafts 78 made of an electrically conductive material. The ends of shafts 78 are mounted on ring sections 22 and 24, respectively being journaled in the apertures 26 provided thereon such that the shafts are rotatable with respect to the ring sections. The non-threaded end portions of each shaft 78 extend beyond each of the ring sections 22 and 24, respectively. On one of the extended end portions (right side as viewed in FIGS. 1 and 2), a retaining clip 79 is provided to apply a constant torque to the shaft 78. On the other of the extended end portions (that on the left hand side as viewed in FIGS. 1 and 2) a pinion gear 80 is mounted. The rotation of pinion gear 80 will cause the shaft associated therewith to rotate relative to turret B. On each shaft 80 is contact member 82 having an internally threaded portion which engages the external threads of shaft 78 upon which it is mounted. The structure of contact member 82 is best shown in FIGS. 5 and 6.

Contact member 82 comprises a base portion 84, which, at one end thereof, has a thread engaging portion 86. At the other end of base portion 84 and extending generally downward (as seen in the Figures) at an acute angle relative thereto, is a bifuricated resistive strip engaging portion 88. Also mounted on body portion 84, but extending radially outwardly and above shaft 78 is a flag 90 which can be utilized to accurately determine the relative position of contact member 82 with respect to the shaft 78 on which it is mounted and, thus, the resistive strip which it engages.

The contact member 82 is displaced along the axis of the shaft 78 upon which it is mounted as the shaft is rotated. The fine tune speed depends upon the change in tuned frequency per degree of shaft rotation. As explained above, the resistive strips for the channel within each band are provided with a preset length such that the fine tune speed of the channels within each band is approximately equal.

The rotation of pinion gears 80, which, in turn, rotates shaft 78, is controlled by the contact means position varying means H which is preferably a thumbwheel 92 which is mounted between enclosure 10 and the front wall of the communications receiver 16 and which protrudes through openings in each such that one side of thumbwheel 92 is accessible from the front of the communications receiver and the other side extends into enclosure 10.

Thumbwheel 92 is mounted on a shaft 94 which, in turn, is journaled in openings on the opposite sides of a U-shaped bracket 96 mounted on support A. The apertures on bracket 96 are elongated and shaft 94 is spring loaded such that it is normally in the position shown in FIG. 2a wherein it is disengaged from any of the pinion gears 80. However, when the thumbwheel 92 is depressed in the direction of the arrow shown in FIG. 2, thumbwheel 92 engages one of the pinion gears 80, the pinion gear 80 which is engaged being that which is associated with the contact means of the resistive strip corresponding to the channel tuned. Thus, for the channel tuned, which is determined by the rotational position of turret B, fine tuning can be accomplished by the depression and subsequent rotation of the thumbwheel 92 which, in turn, rotates the pinion 80 and shaft 78 corresponding to the tuned channel. The rotation of shaft 78 causes the displacement of contact 82 along the aligned resistive strip, thereby varying the fine tuning setting of the selected channel.

Electrical connections with turret B are made by way of means I and means J, both of which are mounted on a base 98 which is situated in the lower right hand corner (as shown in FIGS. 1 and 2) of enclosure 10. Means I comprises a pair of spaced brushes or contacts 100 and 102 which are situated to be operably connected to annular conductive strips 70 and 72, respectively, on coupling portion D of turret B. Contacts or brushes 100 and 102 are respectively electrically connected to the opposite polarity terminals of an energization source (not shown). The resistive strips are preferably, but not necessarily, electrically connected in parallel between annular conductive strips 70 and 72, as is illustrated. In this case, connecting annular conductive strips 70 and 72 to a source causes the energization of the parallel circuit which is formed of the resistive strips. It should be noted that in the embodiment illustrated, annular conductive strips 70 and 72 maintain contact with brushes or contacts 100 and 102, respectively, throughout all rotational positions of turret B. However, if the resistive strips are not connected in parallel, annular conductive strip 70 will be made up of a plurality of electrically isolated parts, one of which is connected to each resistive strip. Only the appropriate part of strip 70 will then be engaged by the contact to energize the resistive strip corresponding to the desired channel.

Also situated on base 98 is a third brush or contact 104 which comprises means J. Brush or contact 104 is situated on base 98 in such a manner so as to engage the extended portion of shaft 78 which is aligned with the resistive strip F corresponding to the channel which is tuned. Thus, electrical connection is made between brush or contact 104, shaft 78, the contact member 82 mounted thereon, and the resistive strip corresponding to the channel to be tuned. In this manner, the signal which appears on brush or contact 104 has a magnitude which is determined by the point of engagement between the contact member 82 and the resistive strip corresponding to the channel tuned and, thus, this signal is utilized as the input of voltage to the varactor tuner. A variation in the point of contact between the contact member and the aligned resistive strip will cause a variation in the voltage which appears on brush or contact 104 and, thus, a variation in the tuned frequency. It should be noted that contact 104 is situated so as to engage only a single shaft 78 at any one time, this shaft corresponding to the channel tuned. It should also be noted that the shaft which is engaged by brush or contact 104 is the same shaft whose pinion gear 80 is engaged by thumbwheel 92 such that variations of the fine tune setting for the selected channel can be achieved.

Turret B is mounted on shaft 11 which is journaled in the opposite sides of enclosure 10 and which extends through enclosure 10 towards the right (as seen in FIGS. 1 and 2). In addition to turret B, a detent wheel 106 situated within enclosure 10 is mounted for rotation with shaft 11. A spring loaded detent element 108, also mounted within enclosure 10 by means of a screw 110, cooperates with detent wheel 106 in the wall known detent fashion so as to accurately position the shaft 78 aligned with the resistive strip F corresponding to the tuned channel with both brush or contact 104 and thumbwheel 92.

Mounted on a portion of shaft 11 extending beyond enclosure 10 is a gear 112 which meshes with a second gear 114 rotatably mounted on a bracket 14 by means of a shaft 116. Shaft 116 extends beyond wall 12 of support A through an opening in the front wall 16 of the chassis of the communications receiver. Preferably, a knob 118 is mounted on the end of shaft 116 to facilitate the manipulation thereof. In order to change channels, knob 118 is rotated, thereby rotating gears 114 and 112, shaft 11 and turret B to bring the contact means G corresponding to the selected channel in contact with brush or contact 104 and thumbwheel 92. In addition, an indicia display device L, of any conventional design, can be operatively connected to shaft 11 such that channel indicia corresponding to the selected channel can be displayed at the appropriate portion of the chassis of the communications receiver.

The present invention is, therefore, a controller for a varactor tuner which comprises a rotatable turret divided into a signal determining portion for generating the necessary input signal for the varactor and a coupling portion, which extends axially beyond the signal determining portion, and which permits positive electrical connection between the support and the turret in a simple and direct manner. The resistive and conductive strips which form the varactor tuner input signal are situated on a planar base to facilitate the manufacture thereof. The base is thereafter formed in a substantially cylindrical configuration to produce the turret. The conductive strips on the signal determining portion are operatively connected to the annular conductive strips on the coupling portion by means of a pair of intermediary conductor strips one of which is situated on the outer surface of the base forming the surface of the cylindrical body, the other of which is situated on the reverse side of the base forming the exterior surface of the cylindrical body, so as to provide simplicity of design and ease of manufacture. Electrical connection between the annular conductive strips and the support is accomplished by a pair of spaced brushes or contacts which engage the conductive strips in all rotational positions of the turret. Channel selection is achieved by means of engagement of a third brush or contact with a selected contact means aligned with the resistive strip corresponding to the channel desired. All of the brushes or contacts are situated on the same side of turret B for simplicity of design and ease of manufacture and assembly. Further, each of the resistive strips within a given band has a length preselected such that the change in the magnitude of the tuning signal required to produce a given frequency change in the varactor tuner is achieved by substantially equal variations in the position of the contact means relative to the resistive strip, thereby achieving an equal fine tune speed within the channels of each band.

While only a single embodiment of the present invention is disclosed herein for purposes of illustration, it is obvious that many variations and modifications can be made thereto. It is intended to cover all of these variations and modifications which fall within the scope of the invention as defined by the annexed claims.

We claim:

1. A controller comprising a support, a turret rotatably mounted on said support and having a substantially cylindrical surface, said turret comprising a signal determining portion having situated on said surface a plurality of resistive strips, and first and second conductive strips, said first conductive strip being connected to one end of each of said resistive strips and said second conductive strip being connected to the other end of each of said strips, an electrical coupling portion extending axially beyond said signal determining portion and comprising first and second annular conductive strips, said first annular strip being operatively connected to said first conductive strip by means of a third conductive strip and said second annular strip being operably connected to said second conductive strip, means mounted on said turret to individually contact each of said resistive strips at a variable location thereon and effective, when said resistive strips are energized, to produce a tuning signal thereon, the magnitude of which is determined by said location, means situated on said support in alignment with said coupling portion, adapted to be operatively connected to an energization source, and effective to electrically connect said coupling portion to said source so as to energize said strips, and means on said support aligned with said contact means and effective to electrically engage a selected one of said individual strip contacting means to obtain said tuning signal therefrom, said one individual strip contacting means being selected in accordance with the rotational position of said turret.

2. The controller of claim 1 further comprising a base affixed to the surface of said turret upon which said resistive strips are mounted.

3. The apparatus of claim 2 wherein said third conductive strip is, at least in part, situated on the interior surface of said base.

4. The controller of claim 2 wherein said contact means comprises a plurality of rotatable shafts and wherein said signal determining portion further comprises a pair of raised spaced ring sections between which each of said conductive shafts is rotatably mounted.

5. The controller of claim 4 further comprising a fourth conductive strip operably connecting said second annular strip to said second conductive strip, said fourth conductive strip passing through an opening in one of said ring sections.

6. The controller of claim 3 wherein said contact means comprises a rotatable shaft and wherein said signal determining portion further comprises a pair of raised spaced ring sections between which said conductive shaft is rotatably mounted.

7. The controller of claim 6 further comprising a fourth conductive strip operably connecting said second annular strip to said second conductive strip, said fourth conductive strip passing through an opening in one of said ring sections.

8. The controller of claim 3 wherein said connecting means aligned with said coupling portion comprises first and second brushes engaging said first and second annular strips, respectively.

9. The controller of claim 8 wherein said connecting means aligned with said coupling portion comprises a third brush engaging said selected one of said contact means.

10. The controller of claim 9 wherein said three brushes are situated at one end of said turret.

11. The controller of claim 9 wherein said contact means comprises a plurality of rotatable conductive shafts, each of which has a contact member movable thereon in accordance with the rotation thereof, to contact one of said resistive strips and wherein said third brush engages a selected one of said shafts.

12. The controller of claim 11 wherein said shafts extend outwardly at one end of said signal determining means to contact which third brush.

13. The controller of claim 12 wherein said contact member has flag thereon.

14. The controller of claim 1 wherein said contact means comprises a plurality of rotatable shafts and wherein said signal determining portion further comprises a pair of raised spaced ring sections between which each of said conductive shafts are rotatably mounted.

15. The controller of claim 14 further comprising a fourth conductive strip operably connecting said second annular strip to said second conductive strip, said fourth conductive strip passing through an opening in one of said ring sections.

16. The controller of claim 1 wherein said connecting means aligned with said coupling portion comprises first and second brushes engaging said first and second annular strips, respectively.

17. The controller of claim 16 wherein said connecting means aligned with said coupling portion comprises a third brush engaging said selected one of said contact means.

18. The controller of claim 17 wherein said three brushes are situated at one end of said turret.

19. The controller of claim 17 wherein said contact means comprises a plurality of rotatable conductive shafts, each of which has a contact member movable thereon in accordance with the rotation thereof, to contact one of said resistive strips and wherein said third brush engages a selected one of said shafts.

20. The controller of claim 19 wherein said shafts extend outwardly at one end of said signal detering means to contact said third brush.

21. The controller of claim 19 wherein said contact member has a flag thereon.

22. A controller comprising a support, a turret rotatably mounted on said support and having a base forming the interior and an exterior radial surface thereof, a plurality of resistive strips and a first pair of spaced conductive strips situated on said exterior radial surface, said resistive strips being situated in a parallel circuit between said conductive strips of said first pair, a second pair of annular conductive strips situated on said exterior radial surface, third and fourth conductive strips respectively operatively connecting a different one of said conductive strips of said first pair with each of said conductive strips in said second pair, one of said third and fourth conductive strips being situated on said exterior radial surface and the other of said strips being situated at least in part on said interior radial surface, means on said turret for electrically contacting each of said resistive strips at a variable location thereon and effective, when said circuit is energized, to produce a tuning signal, the magnitude of which is dependent upon said location, means adapted to be operatively connected to an external energization source and said second pair of conductive strips, respectively, to energize said circuit, and means effective to electrically engage one of said contact means, said one contact means being selected in accordance with the rotational position of said turret, to obtain said tuning signal therefrom.

23. The controller of claim 22 wherein said second pair of conductive strips are located on a portion of said exterior radial surface extending in the direction of the rotational axis of said turret beyond the portion of the turret upon which the resistive strips are located.

24. The controller of claim 23 wherein said energizing means comprises first and second brushes, said brushes operatively engaging said second pair of conductive strips, respectively, and wherein said contact means engaging means comprises a third brush, said third brush operatively contacting said selected contact means.

25. The controller of claim 24 wherein said three brushes are situated at one end of said turret.

26. The controller of claim 25 further comprising means for mounting said contact means on said turret wherein said contact means extends beyond said mounting means at said one end of said turret.

27. A controller for producing a tuning signal to control a varactor tuner to tune a desired frequency comprising a support, a body movable relative to said support, a plurality of resistive strips situated on the surface of said body and operatively connected to form a part of an electrical circuit, a plurality of electrically isolated contact means, a different one of which engages each of said strips at a variable position thereon in order to produce a tuning signal whose magnitude is dependent upon said position, some of said strips being adapted to produce a tuning signal for a different frequency range than others of said strips and said some and others of said strips, respectively, having a length preselected such that the change in the magnitude of the tuning signal required to produce a given frequency change in the varactor tuner is achieved, in said some and others of said strips, through a substantially equal variation of said position.

28. The controller of claim 27 wherein the length of each of said same and others of said strips is inversely proportional to the amount of change in the magnitude of the tuning signal required to produce a given frequency change in the varactor tuner.

29. A controller comprising a support and a turret rotatably mounted on said support, said turret comprising a cylindrical body portion having a base forming the exterior surface thereof, and a pair of ring sections, one of said ring sections being situated essentially at one end of said body portion and the other of said ring sections being situated along said body portion so as to divide said body portion into first and second sections, a plurality of parallelly situated resistive strips mounted on said first section at spaced intervals around the surface thereof, a plurality of parallelly situated conductive shafts rotatably mounted between said ring sections at a given distance from said surface, a different one of said shafts being aligned with each of said strips, a conductive contact mounted on each of said shafts for movement relative thereto in accordance with the rotation thereof and spanning said given distance between said shaft and the aligned strip, first conductive means electrically connecting one end of said of said resistive strips and second conductive means electrically connecting the other end of each of said resistive strips, said second section comprising first and second annular conductive strips situated on a surface thereof and electrically connected to said first and second conductive means respectively, said electrical connection between said first annular strip and said first conductive strip being a third conductive means, said third conductive means being situated, at least in part, on the interior surface of said base, and first, second and third engaging means on said support, said first and second engaging means being situated to engage said first and second annular strips, respectively, in all rotational positions of said turret and said third engaging means situated to engage one of said shafts, said one of said shafts being selected in accordance with the rotational position of said turret.

30. The controller according to claim 29 wherein one of said ring sections has an opening therein and said third conductive means extends through said opening.

31. The controller of claim 29, wherein said first, second and third engaging means are located on the same side of said turret.

32. The controller of claim 31 wherein said shafts extend beyond said first section at said side of said turret.

33. The controller of claim 29 wherein said shafts are journaled in said ring sections.

34. The controller of claim 29 wherein said shaft mounted contact means each have a flag mounted thereon.

35. The controller of claim 29 wherein the signal produced at said third engaging means is utilized to control a signal controlled tuning element to select a frequency in accordance therewith and wherein each of said resistive strips has a length preselected such that the change in the magnitude of said signal required to produce a given frequency change in said tuning element is achieved through the variation of the position of the contact means on said selected shaft by an equal distance for each resistive strip.

36. The controller of claim 35 wherein the length of each strip is inversely proportional to the amount of change in the magnitude of the tuning signal required to produce a given frequency change in said tuning element.

37. The controller of claim 36 wherein said resistive strips are connected in a parallel relationship.

* * * * *